(12) United States Patent
Shatalov et al.

(10) Patent No.: US 8,981,403 B2
(45) Date of Patent: Mar. 17, 2015

(54) PATTERNED SUBSTRATE DESIGN FOR LAYER GROWTH

(75) Inventors: Maxim S Shatalov, Columbia, SC (US); Rakesh Jain, Columbia, SC (US); Jinwei Yang, Lexington, SC (US); Michael Shur, Latham, NY (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 85 days.

(21) Appl. No.: 13/605,007

(22) Filed: Sep. 6, 2012

(65) Prior Publication Data

US 2013/0056770 A1 Mar. 7, 2013

Related U.S. Application Data

(60) Provisional application No. 61/531,400, filed on Sep. 6, 2011.

(51) Int. Cl.
*H01L 33/00* (2010.01)
*H01L 21/02* (2006.01)
*H01L 33/22* (2010.01)

(52) U.S. Cl.
CPC ........ *H01L 21/0237* (2013.01); *H01L 21/0242* (2013.01); *H01L 21/0243* (2013.01); *H01L 21/02458* (2013.01); *H01L 21/0254* (2013.01); *H01L 21/02639* (2013.01); *H01L 21/0265* (2013.01); *H01L 33/22* (2013.01)
USPC ................ 257/98; 257/88; 257/89; 257/99; 257/94; 257/95; 257/730; 257/E21.121; 257/E21.126; 257/E21.127; 438/29

(58) Field of Classification Search
CPC ..................................................... H01L 33/22
USPC ................. 257/98, 730, 88, 89, 99, 94, 95, 257/E21.121, E21.126, E21.127; 438/29
See application file for complete search history.

(56) References Cited

U.S. PATENT DOCUMENTS 4,497,974 A 2/1985 Deckman et al.
6,441,403 B1 8/2002 Chang et al.
(Continued)

FOREIGN PATENT DOCUMENTS

JP 2005314121 A 11/2005
JP 2006332714 A 12/2006
WO 2009102033 A1 8/2009

OTHER PUBLICATIONS

Park, International Application No. PCT/US2012/053892, International Search Report and the Written opinion of the International Searching Authority, SETI-0066-PCT, Jan. 31, 2013, 12 pages.
(Continued)

*Primary Examiner* — Kyoung Lee
*Assistant Examiner* — Ratisha Mehta
(74) *Attorney, Agent, or Firm* — LaBatt, LLC

(57) ABSTRACT

A patterned surface for improving the growth of semiconductor layers, such as group III nitride-based semiconductor layers, is provided. The patterned surface can include a set of substantially flat top surfaces and a plurality of openings. Each substantially flat top surface can have a root mean square roughness less than approximately 0.5 nanometers, and the openings can have a characteristic size between approximately 0.1 micron and five microns.

20 Claims, 12 Drawing Sheets

(56) References Cited

U.S. PATENT DOCUMENTS

| | | |
|---|---|---|
| 6,657,236 B1 | 12/2003 | Thibeault et al. |
| 7,211,831 B2 | 5/2007 | Erchak et al. |
| 7,335,920 B2 | 2/2008 | Denbaars et al. |
| 7,355,210 B2 | 4/2008 | Ou et al. |
| 7,473,936 B2 | 1/2009 | Tran et al. |
| 7,524,686 B2 | 4/2009 | Chu et al. |
| 7,629,195 B2 | 12/2009 | Tran et al. |
| 7,633,097 B2 | 12/2009 | Kim et al. |
| 7,704,763 B2 | 4/2010 | Fujii et al. |
| 7,932,106 B2 | 4/2011 | Li |
| 2005/0179130 A1 | 8/2005 | Tanaka et al. |
| 2005/0227379 A1* | 10/2005 | Donofrio ............... 438/4 |
| 2008/0277686 A1 | 11/2008 | Tsai |
| 2009/0035885 A1* | 2/2009 | Karlicek et al. ........ 438/45 |
| 2010/0136728 A1 | 6/2010 | Horng et al. |
| 2010/0255621 A1 | 10/2010 | Minato et al. |
| 2010/0283065 A1 | 11/2010 | Yen |
| 2010/0308359 A1* | 12/2010 | Singh et al. ........... 257/98 |
| 2011/0012109 A1* | 1/2011 | Kryliouk et al. ....... 257/49 |

OTHER PUBLICATIONS

Tokuda et al., "Substrate nitridation effect and low temperature growth of GaN on sapphire (0 0 0 1) by plasma-excited organometallic vapor-phase epitaxy", Journal of Crystal Growth 183 (1998) 62-68.

Kim et al., "Changes in the growth mode of low temperature GaN buffer layers with nitrogen plasma nitridation of sapphire substrates", Appl. Phys. Lett. 71 (9), Sep. 1, 1997, 1228-1230.

Uchida et al., "Nitridation process of sapphire substrate surface and its effect on the growth of GaN", J. Appl. Phys. 79 (7), Apr. 1, 1996, 3487-3491.

Tanaka et al., "Initial stage of aluminum nitride film growth on 6H silicon carbide by plasma assisted, gassource molecular beam epitaxy", Appl. Phys. Lett. 66 (1), Jan. 2, 1995, 37-39.

Jain et al., "Migration enhanced lateral epitaxial overgrowth of AlN and AlGaN for high reliability deep ultraviolet light emitting diodes", Appl. Phys. Lett. 93, 051113 (2008), 4 pages.

* cited by examiner

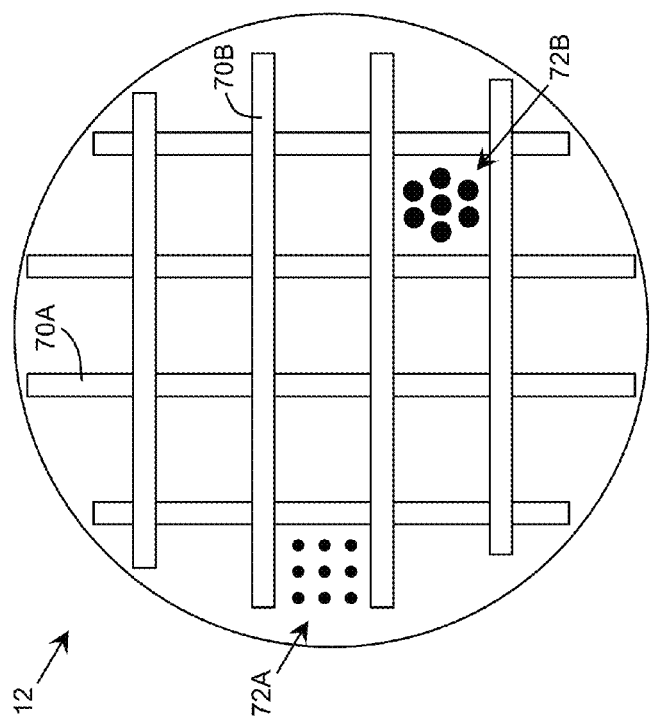

PATTERNED SUBSTRATE DESIGN FOR LAYER GROWTH

REFERENCE TO RELATED APPLICATIONS

The current application claims the benefit of U.S. Provisional Application No. 61/531,440, titled "Light Emitting Diodes with Optimal Patterned Substrate for Growing Nitride Based Semiconductor Layers," which was filed on 6 Sep. 2011, and which is hereby incorporated by reference. Aspects of the invention also are related to U.S. patent application Ser. No. 13/524,350, titled "Device with Inverted Large Scale Light Extraction Structures," which was filed on 15 Jun. 2012, and U.S. patent application Ser. No. 13/517,711, titled "Emitting Device with Improved Extraction," which was filed on 14 Jun. 2012, both of which are hereby incorporated by reference.

GOVERNMENT LICENSE RIGHTS

This invention was made with Federal government support under Contract No. W911NF-10-2-0023 awarded by Defense Advanced Research Projects Agency (DARPA). The government has certain rights in the invention.

TECHNICAL FIELD

The disclosure relates generally to semiconductor devices, and more particularly, to a design of a patterned substrate for layer growth, e.g., group III-nitride layer and emitting device growth.

BACKGROUND ART

Semiconductor emitting devices, such as light emitting diodes (LEDs) and laser diodes (LDs), include solid state emitting devices composed of group III-V semiconductors. A subset of group III-V semiconductors includes group III nitride alloys, which can include binary, ternary and quaternary alloys of indium (In), aluminum (Al), gallium (Ga), and nitrogen (N). Illustrative group III nitride based LEDs and LDs can be of the form $In_y Al_x Ga_{1-x-y} N$, where x and y indicate the molar fraction of a given element, $0 \leq x$, $y \leq 1$, and $0 \leq x+y \leq 1$. Other illustrative group III nitride based LEDs and LDs are based on boron (B) nitride (BN) and can be of the form $Ga_z In_y Al_x B_{1-x-y-z} N$, where $0 \leq x$, y, $z \leq 1$, and $0 \leq x+y+z \leq 1$.

An LED is typically composed of semiconducting layers. During operation of the LED, an applied bias across doped layers leads to injection of electrons and holes into an active layer where electron-hole recombination leads to light generation. Light is generated with uniform angular distribution and escapes the LED die by traversing semiconductor layers in all directions. Each semiconducting layer has a particular combination of molar fractions (e.g., x, y, and z) for the various elements, which influences the optical properties of the layer. In particular, the refractive index and absorption characteristics of a layer are sensitive to the molar fractions of the semiconductor alloy.

An interface between two layers is defined as a semiconductor heterojunction. At an interface, the combination of molar fractions is assumed to change by a discrete amount. A layer in which the combination of molar fractions changes continuously is said to be graded. Changes in molar fractions of semiconductor alloys can allow for band gap control, but can lead to abrupt changes in the optical properties of the materials and result in light trapping. A larger change in the index of refraction between the layers, and between the substrate and its surroundings, results in a smaller total internal reflection (TIR) angle (provided that light travels from a high refractive index material to a material with a lower refractive index). A small TIR angle results in a large fraction of light rays reflecting from the interface boundaries, thereby leading to light trapping and subsequent absorption by layers or LED metal contacts.

Roughness at an interface allows for partial alleviation of the light trapping by providing additional surfaces through which light can escape without totally internally reflecting from the interface. Nevertheless, light only can be partially transmitted through the interface, even if it does not undergo TIR, due to Fresnel losses. Fresnel losses are associated with light partially reflected at the interface for all the incident light angles. Optical properties of the materials on each side of the interface determines the magnitude of Fresnel losses, which can be a significant fraction of the transmitted light. Roughness at an interface also allows for partial alleviation of the buildup of stress fields in the semiconductor layers.

SUMMARY OF THE INVENTION

Aspects of the invention provide a patterned surface for improving the growth of semiconductor layers, such as group III nitride-based semiconductor layers. The patterned surface can include a set of substantially flat top surfaces and a plurality of openings. Each substantially flat top surface can have a root mean square roughness less than approximately 0.5 nanometers, and the openings can have a characteristic size between approximately 0.1 micron and five microns.

A first aspect of the invention provides a device comprising: a substrate comprising a patterned surface, wherein the patterned surface includes a set of substantially flat top surfaces and a plurality of openings, wherein each substantially flat top surface has a root mean square roughness less than approximately 0.5 nanometers, and wherein the plurality of openings have a characteristic size between approximately 0.1 micron and five microns.

A second aspect of the invention provides a method comprising: designing a patterned surface for a substrate of a device, wherein the patterned surface includes a set of substantially flat top surfaces and a plurality of openings, wherein each substantially flat top surface has a root mean square roughness less than approximately 0.5 nanometers, and wherein the plurality of openings have a characteristic size between approximately 0.1 micron and five microns.

A third aspect of the invention provides a system comprising: a computer system configured to implement a method of fabricating a device, the method comprising: fabricating a patterned surface for a substrate of the device, wherein the patterned surface includes a set of substantially flat top surfaces and a plurality of openings, wherein each substantially flat top surface has a root mean square roughness less than approximately 0.5 nanometers, and wherein the plurality of openings have a characteristic size between approximately 0.1 micron and five microns; and growing a group III-nitride layer directly on the patterned surface of the substrate.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIG. 10 shows a two dimensional top view of an illustrative patterned surface of a substrate according to a third embodiment.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

As indicated above, aspects of the invention provide a patterned surface for improving the growth of semiconductor layers, such as group III nitride-based semiconductor layers. The patterned surface can include a set of substantially flat top surfaces and a plurality of openings. Each substantially flat top surface can have a root mean square roughness less than approximately 0.5 nanometers, and the openings can have a characteristic size between approximately 0.1 micron and five microns. As used herein, unless otherwise noted, the term "set" means one or more (i.e., at least one) and the phrase "any solution" means any now known or later developed solution.

Figure 1:
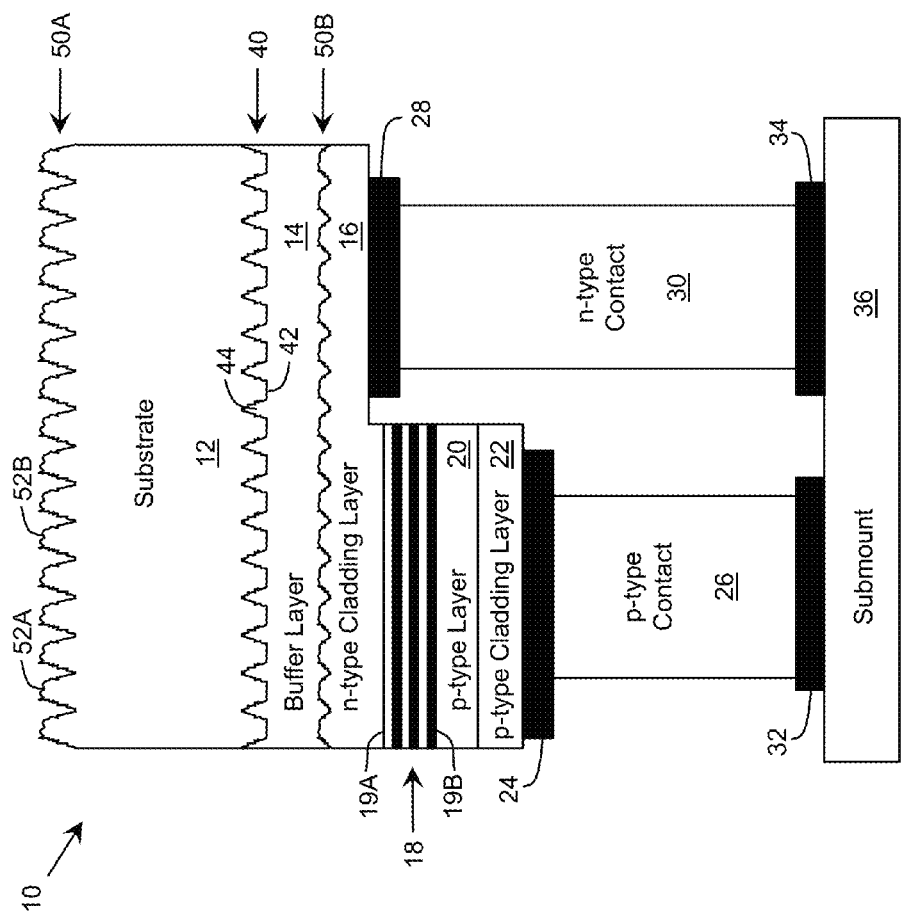
FIG. 1 shows a schematic structure of an illustrative emitting device according to an embodiment.

Turning to the drawings, FIG. 1 shows a schematic structure of an illustrative emitting device 10 according to an embodiment. In a more particular embodiment, the emitting device 10 is configured to operate as a light emitting diode (LED), such as a conventional or super luminescent LED. Alternatively, the emitting device 10 can be configured to operate as a laser diode (LD). In either case, during operation of the emitting device 10, application of a bias comparable to the band gap results in the emission of electromagnetic radiation from an active region 18 of the emitting device 10. The electromagnetic radiation emitted by the emitting device 10 can comprise a peak wavelength within any range of wavelengths, including visible light, ultraviolet radiation, deep ultraviolet radiation, infrared light, and/or the like.

The emitting device 10 includes a heterostructure comprising a substrate 12, a buffer layer 14 adjacent to the substrate 12, an n-type cladding layer 16 (e.g., an electron supply layer) adjacent to the buffer layer 14, and an active region 18 having an n-type side 19A adjacent to the n-type cladding layer 16. Furthermore, the heterostructure of the emitting device 10 includes a p-type layer 20 (e.g., an electron blocking layer) adjacent to a p-type side 19B of the active region 18 and a p-type cladding layer 22 (e.g., a hole supply layer) adjacent to the p-type layer 20.

In a more particular illustrative embodiment, the emitting device 10 is a group III-V materials based device, in which some or all of the various layers are formed of elements selected from the group III-V materials system. In a still more particular illustrative embodiment, the various layers of the emitting device 10 are formed of group III nitride based materials. Group III nitride materials comprise one or more group III elements (e.g., boron (B), aluminum (Al), gallium (Ga), and indium (In)) and nitrogen (N), such that $B_W Al_X Ga_Y In_Z N$, where $0 \leq W, X, Y, Z \leq 1$, and $W+X+Y+Z=1$. Illustrative group III nitride materials include AlN, GaN, InN, BN, AlGaN, AlInN, AlBN, AlGaInN, AlGaBN, AlInBN, and AlGaInBN with any molar fraction of group III elements.

An illustrative embodiment of a group III nitride based emitting device 10 includes an active region 18 (e.g., a series of alternating quantum wells and barriers) composed of $In_y Al_x Ga_{1-x-y} N$, $Ga_z In_y Al_x B_{1-x-y-z} N$, an $Al_x Ga_{1-x} N$ semiconductor alloy, or the like. Similarly, both the n-type cladding layer 16 and the p-type layer 20 can be composed of an $In_y Al_x Ga_{1-x-y} N$ alloy, a $Ga_z In_y Al_x B_{1-x-y-z} N$ alloy, or the like. The molar fractions given by x, y, and z can vary between the various layers 16, 18, and 20. The substrate 12 can be sapphire, silicon (Si), germanium, silicon carbide (SiC), AlN, GaN, BN, AlGaN, AlInN, AlON, $LiGaO_2$, AlGaBN, AlGaInN, AlGaInBN, or another suitable material, and the buffer layer 14 can be composed of AlN, an AlGaN/AlN superlattice, and/or the like.

As shown with respect to the emitting device 10, a p-type metal 24 can be attached to the p-type cladding layer 22 and a p-type contact 26 can be attached to the p-type metal 24. Similarly, an n-type metal 28 can be attached to the n-type cladding layer 16 and an n-type contact 30 can be attached to the n-type metal 28. The p-type metal 24 and the n-type metal 28 can form ohmic contacts to the corresponding layers 22, 16, respectively. In an embodiment, the p-type metal 24 and the n-type metal 28 each comprise several conductive and reflective metal layers, while the n-type contact 30 and the p-type contact 26 each comprise highly conductive metal. In an embodiment, the p-type cladding layer 22 and/or the p-type contact 26 can be at least partially transparent (e.g., semi-transparent or transparent) to the electromagnetic radiation generated by the active region 18. For example, the p-type cladding layer 22 and/or the p-type contact 26 can comprise a short period superlattice lattice structure, such as an at least partially transparent magnesium (Mg)-doped AlGaN/AlGaN short period superlattice structure (SPSL). Furthermore, the p-type contact 26 and/or the n-type contact 30 can be at least partially reflective of the electromagnetic radiation generated by the active region 18. In another embodiment, the n-type cladding layer 16 and/or the n-type contact 30 can be formed of a short period superlattice, such as an AlGaN SPSL, which is at least partially transparent to the electromagnetic radiation generated by the active region 18.

As used herein, a layer is at least partially transparent when the layer allows at least a portion of electromagnetic radiation in a corresponding range of radiation wavelengths to pass there through. For example, a layer can be configured to be at least partially transparent to a range of radiation wavelengths corresponding to a peak emission wavelength for the light (such as ultraviolet light or deep ultraviolet light) emitted by the active region 18 (e.g., peak emission wavelength+/−five nanometers). As used herein, a layer is at least partially transparent to radiation if it allows more than approximately 0.5 percent of the radiation to pass there through. In a more particular embodiment, an at least partially transparent layer is configured to allow more than approximately five percent of the radiation to pass there through. Similarly, a layer is at least partially reflective when the layer reflects at least a portion of the relevant electromagnetic radiation (e.g., light having wavelengths close to the peak emission of the active region). In an embodiment, an at least partially reflective layer is configured to reflect at least approximately five percent of the radiation.

As further shown with respect to the emitting device 10, the device 10 can be mounted to a submount 36 via the contacts 26, 30. In this case, the substrate 12 is located on the top of the emitting device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the emitting device 10 can comprise a substantially uniform composition or a graded composition. For example, a layer can comprise a graded composition at a heterointerface with another layer. In an embodiment, the p-type layer 20 comprises a p-type blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the emitting device 10 described herein is only illustrative. To this extent, an emitting device/heterostructure can include an alternative layer configuration, one or more additional layers, and/or the like. As a result, while the various layers are shown immediately adjacent to one another (e.g., contacting one another), it is understood that one or more intermediate layers can be present in an emitting device/heterostructure. For example, an illustrative emitting device/heterostructure can include an undoped layer between the active region 18 and one or both of the p-type cladding layer 22 and the electron supply layer 16.

Furthermore, an emitting device/heterostructure can include a Distributive Bragg Reflector (DBR) structure, which can be configured to reflect light of particular wavelength(s), such as those emitted by the active region 18, thereby enhancing the output power of the device/heterostructure. For example, the DBR structure can be located between the p-type cladding layer 22 and the active region 18. Similarly, a device/heterostructure can include a p-type layer located between the p-type cladding layer 22 and the active region 18. The DBR structure and/or the p-type layer can comprise any composition based on a desired wavelength of the light generated by the device/heterostructure. In one embodiment, the DBR structure comprises a Mg, Mn, Be, or Mg$^+$ Si-doped p-type composition. The p-type layer can comprise a p-type AlGaN, AlInGaN, and/or the like. It is understood that a device/heterostructure can include both the DBR structure and the p-type layer (which can be located between the DBR structure and the p-type cladding layer 22) or can include only one of the DBR structure or the p-type layer. In an embodiment, the p-type layer can be included in the device/heterostructure in place of an electron blocking layer. In another embodiment, the p-type layer can be included between the p-type cladding layer 22 and the electron blocking layer.

Regardless, as illustrated in FIG. 1, the device 10 can include a substrate 12 having a patterned surface 40. The patterned surface 40 can be configured to: provide for relaxation of stress buildup between the substrate 12 and an adjacent layer, such as the buffer layer 14; yield a semiconductor layer, such as the buffer layer 14, having a lower density of dislocations; and/or the like. In an embodiment, the patterned surface 40 comprises a set of top surfaces, such as the top surface 42 and a plurality of openings 44, which disrupt the continuity of the set of top surfaces 42. As described herein, each of the set of top surfaces 42 can be substantially flat, which can be configured to provide a set of epi-ready (e.g., ready for epilayer growth) top surfaces 42 for growth of the buffer layer 14. For example, for a substrate formed of sapphire and a buffer layer formed of aluminum nitride, the set of top surfaces 42 can have a root mean square roughness that is less than approximately 0.5 nanometers.

Figure 2:
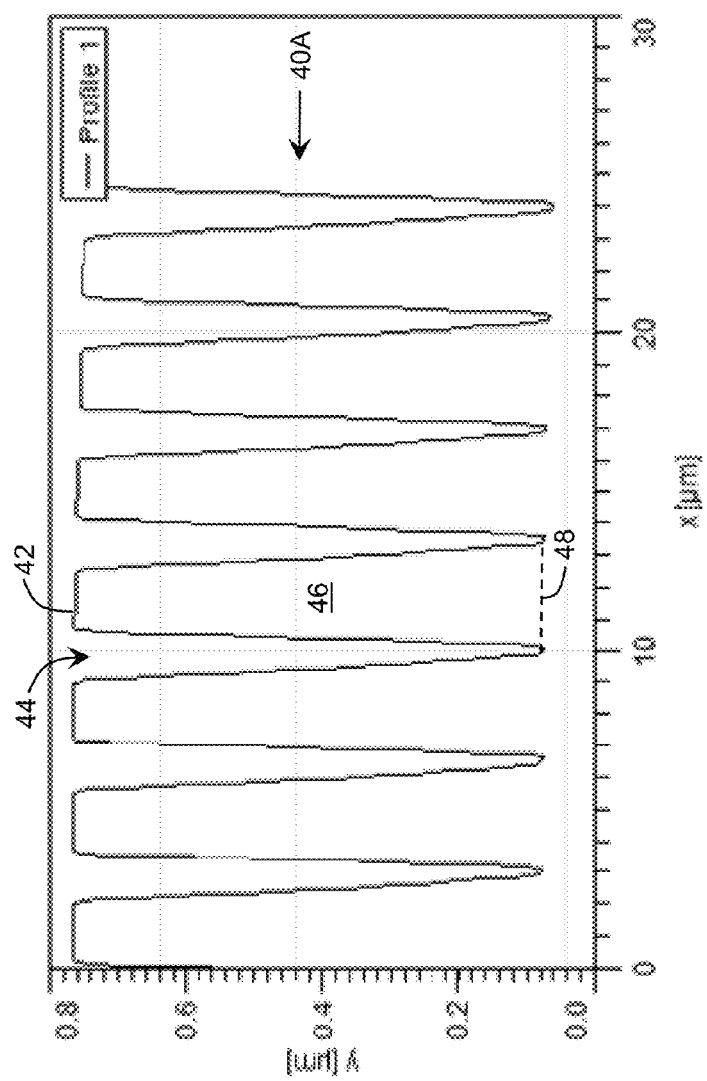
FIG. 2 shows a linear scan of an illustrative patterned surface of a substrate according to an embodiment.
Figure 3:
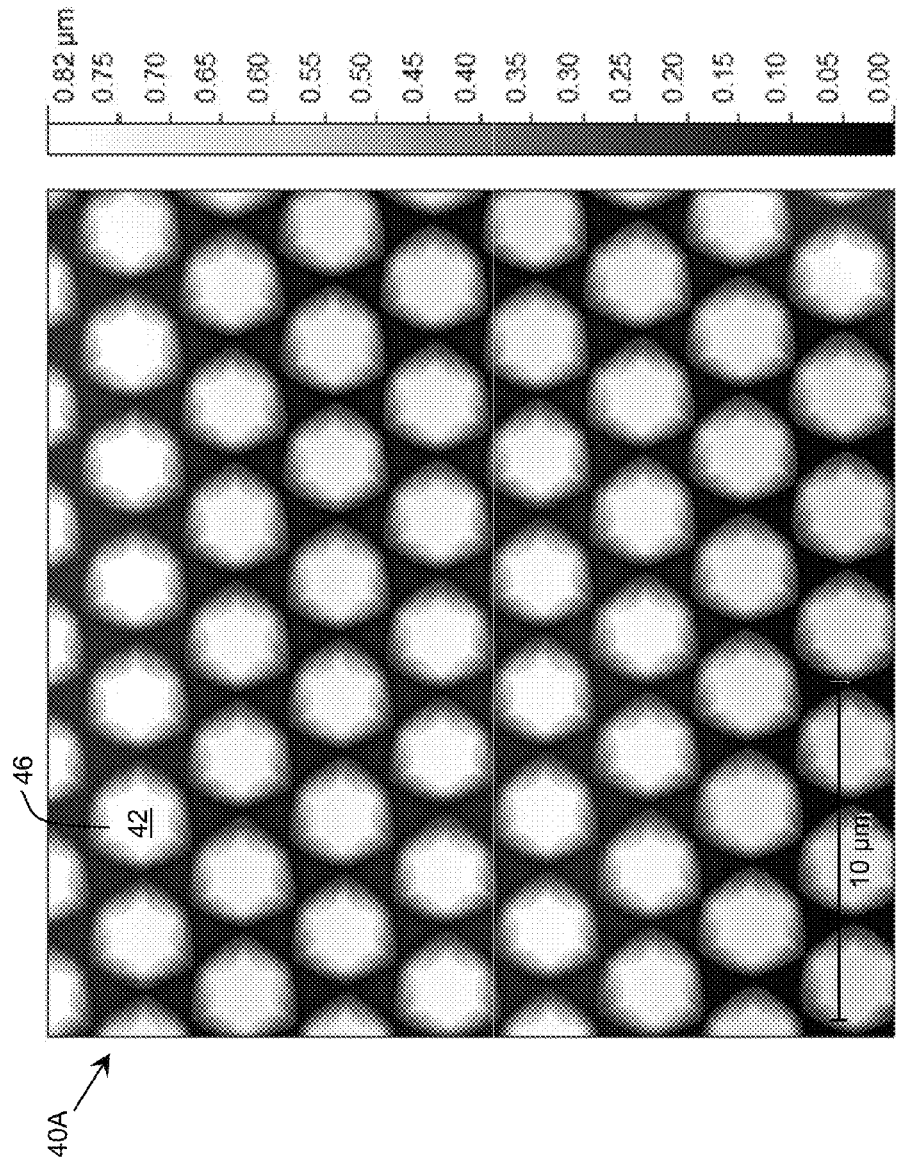
FIG. 3 shows a two dimensional scan of an illustrative patterned surface of a substrate according to an embodiment.
Figure 4:
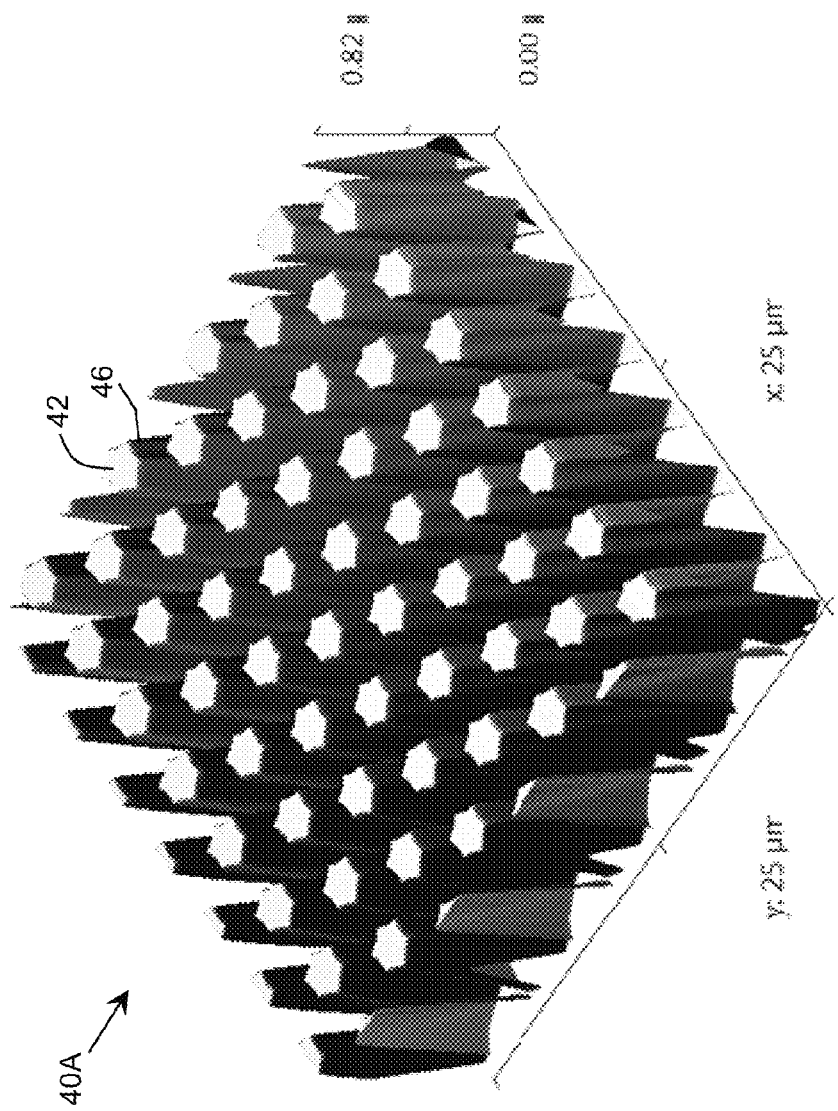
FIG. 4 shows a three dimensional scan of an illustrative patterned surface of a substrate according to an embodiment.

FIGS. 2-4 show linear, two dimensional, and three dimensional scans, respectively, of an illustrative patterned surface 40A of a substrate 12 (FIG. 1) according to an embodiment. In this case, the patterned surface 40A is formed by a plurality of protruding regions, such as region 46, and a plurality of openings 44 between the protruding regions 46. Each protruding region 46 can comprise a substantially flat top surface 42. As used herein, the top surface 42 of a protruding region 46 refers to the surface of the region 46 that is furthest from the substrate 12.

As illustrated, each protruding region 46 can comprise a hexagonal cross-sectional pattern and the plurality of protruding regions 46 can form a hexagonal pattern. However, it is understood that the protruding regions 46 can comprise any combination of one or more of various types/shapes of cross-sectional patterns and form any type of pattern. Furthermore, each protruding region 46 is shown having a base 48 that is approximately 3.5 microns (μm) wide, a top surface 42 having a width of approximately 2.0 μm, and a height of approximately 0.65 μm. In an embodiment, a characteristic size of the plurality of protruding regions 46 is between approximately 0.1 microns and approximately 5.0 microns. Furthermore, a characteristic size of a plurality of openings 44 between the plurality of protruding regions 46 can have a size less than or equal to the characteristic size of the plurality of protruding regions 46.

Figure 5:
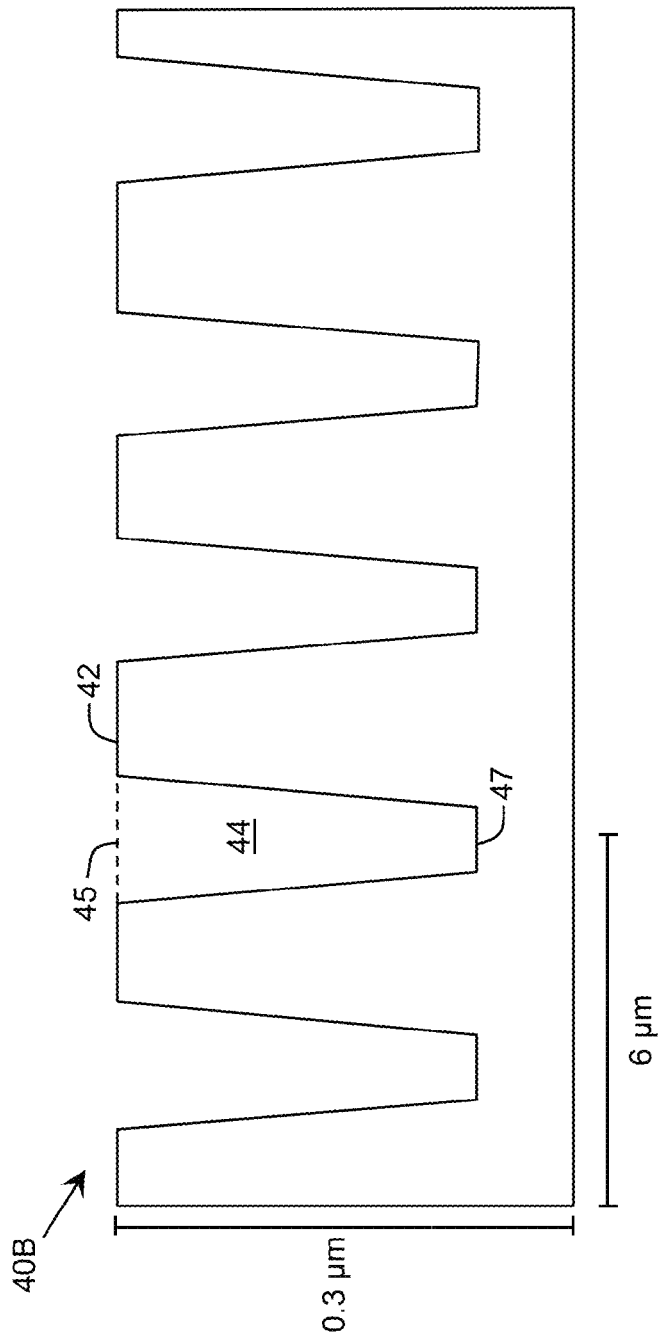
FIG. 5 shows a side view of an illustrative patterned surface of a substrate according to a second embodiment.
Figure 6:
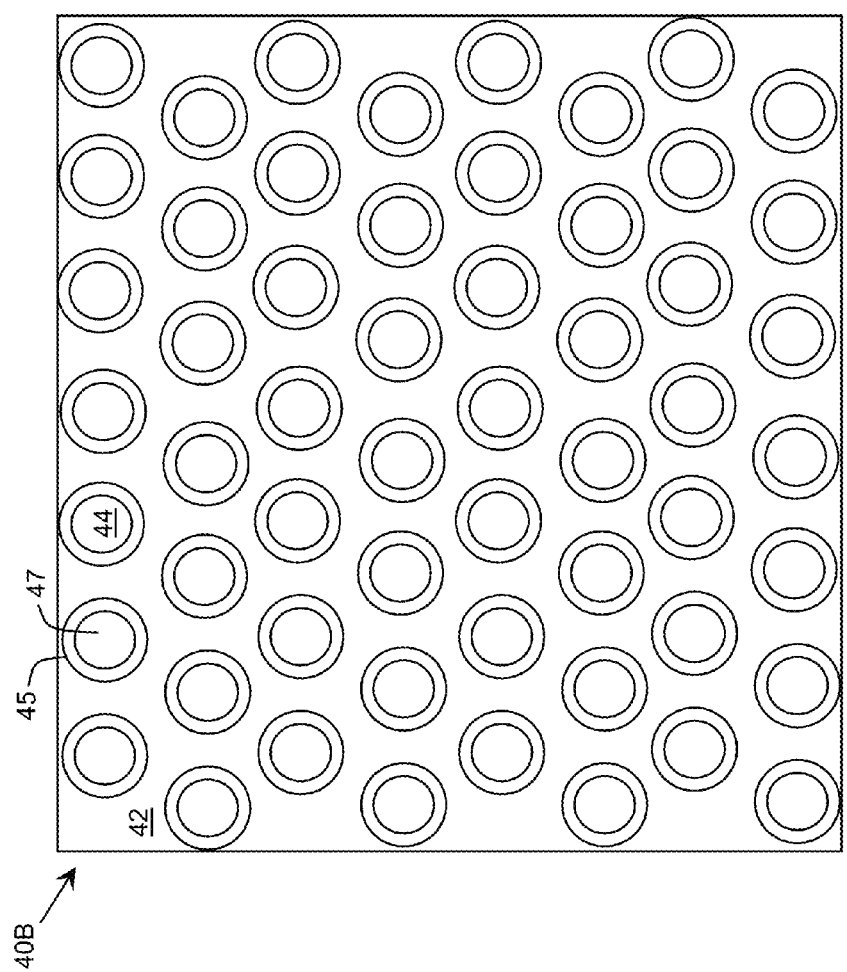
FIG. 6 shows a two dimensional top view of an illustrative patterned surface of a substrate according to the second embodiment.

FIGS. 5 and 6 show a side view and a two dimensional top view, respectively, of an illustrative patterned surface 40B of a substrate 12 (FIG. 1) according to a second embodiment. In this case, the patterned surface 40B includes a top surface 42 into which a plurality of openings 44 are formed. The openings 44 can be spaced from one another by a distance less than approximately twice a diameter of a top opening 45. In an embodiment, each opening 44 can have a top opening 45 of a diameter of approximately 2.0 μm and a bottom surface 47 having a diameter of approximately 1.5 μm. Furthermore, the openings 44 can be spaced from one another by approximately 3.5 μm center to center. As illustrated in FIG. 6, the openings can have substantially circular cross sections and be formed in a hexagonal pattern. However, it is understood that the openings 44 can comprise any combination of one or more of various types/shapes of cross-sectional patterns and form any type of pattern.

The patterned surfaces 40A, 40B can be formed using any solution. For example, for a substrate 12 (FIG. 1) formed of sapphire, AlN, or the like, the patterned surfaces 40A, 40B can be formed using a combination of lithography and etching. In an embodiment, the patterned surface 40A is formed using photolithography and wet chemical etching. However, it is understood that other types of lithography, such as e-beam, stepper, and/or the like, and/or other types of etching, such as dry etching, can be used.

During fabrication of the device 10 (FIG. 1), a semiconductor layer, such as the buffer layer 14 (FIG. 1), is formed directly on the patterned surface 40 of the substrate 12. In an embodiment, the layer 14 comprises a group III-nitride layer, such as AlN, AlGaN, AlGaBN, AlInN, AlGaInN, AlGaInBN, and/or the like, which is grown directly on the patterned surface 40 (FIG. 1). By growing the layer 14 directly on the patterned surface 40, the layer 14 can comprise a single crystal layer of material.

The layer 14 can be formed using any solution. In an embodiment, the layer 14 is grown using directly on the patterned surface 40 of the substrate 12 using an epitaxial process, which favors lateral growth of the layer 14. In an embodiment, the epitaxial process for growing a group III-nitride layer 14 includes a material deposition process selected from the group consisting of: metal organic chemical vapor deposition (MOCVD), molecular beam epitaxy (MBE), hydride vapor phase epitaxy (HVPE), or a modified version of any of MOCVD, MBE, or HVPE. Furthermore, the epitaxial process can be performed at: a temperature between approximately 400 degrees Celsius and approximately 1500 degrees Celsius; a pressure between approximately $1 \times 10^{-5}$ Torr and approximately 1000 Torr; and/or the like. In a more particular embodiment, the temperature is between approximately 1000 degrees Celsius and approximately 1300 degrees Celsius and the pressure is between approximately 20 Torr and approximately 100 Torr, and each can vary during the epitaxial process. Additionally, the epitaxial process can use a flux ratio between ammonia and the group III elements in the growth chamber between approximately 1 and 10000. In a more particular embodiment, the flux ratio is between approximately 250-5000, and can vary during the epitaxial process.

Figure 7:
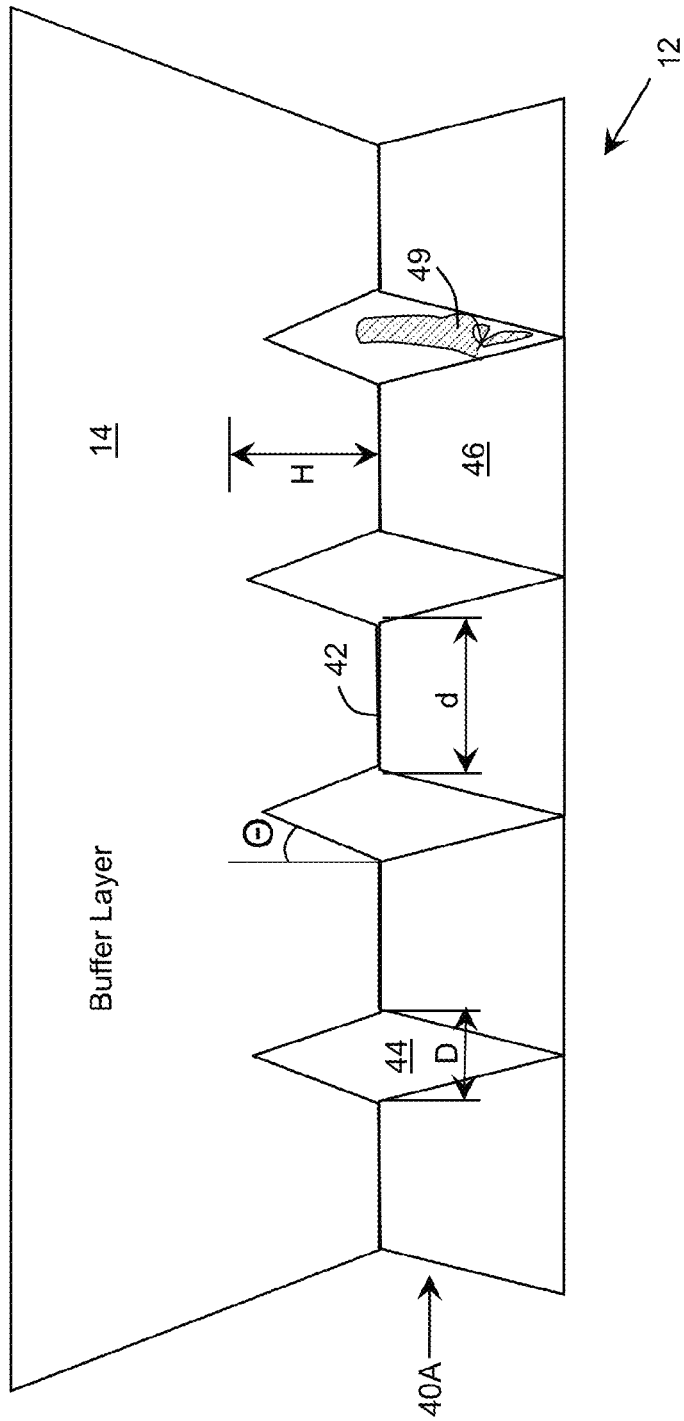
FIG. 7 shows a schematic representation of an illustrative interface between the substrate and the buffer layer according to an embodiment.

In an embodiment, one or more attributes of the patterned surface 40 are configured based on one or more growth attributes for the buffer layer 14 and/or light extraction considerations. To this extent, FIG. 7 shows a schematic representation of an illustrative interface between the substrate 12 and the buffer layer 14 according to an embodiment. In this case, the patterned surface 40A of the substrate 12 can be formed using the plurality of protruding regions 46 as described herein. However, it is understood that similar considerations can be used in forming a patterned surface 40B (FIGS. 5 and 6). Regardless, an opening 44 can comprise a distance D between the top surface 42 of adjacent protruding regions 46, which can be selected based on an angle θ and a height H at which coalescence of the buffer layer 14 is desired. In an embodiment, the distance D is selected such that the following equation is met: D/2=H*tan θ. For a substrate 12 formed of sapphire and a buffer layer 14 comprising aluminum nitride, the angle θ can be approximately ten degrees and the height H can be approximately 4.25 μm. Such a height H can drive some of the dislocations in the buffer layer 14 to the sides of the buffer layer 14. In this case, the distance D can be approximately 1.5 μm. A top surface 42 of a protruding region 46 can have a width d, which is selected to be approximately the same as the distance D or larger, e.g., to prevent the growth of the buffer layer 14 to be dominated by any material 49 of the buffer layer 14 growing in the openings 44. In an embodiment, the width d can be approximately 2 μm. However, it is understood that the height H can be selected such that coalescence is achieved before the epilayer exceeds a certain thickness (e.g., 10-15 μm) to reduce/minimize strain buildup.

Figure 8:
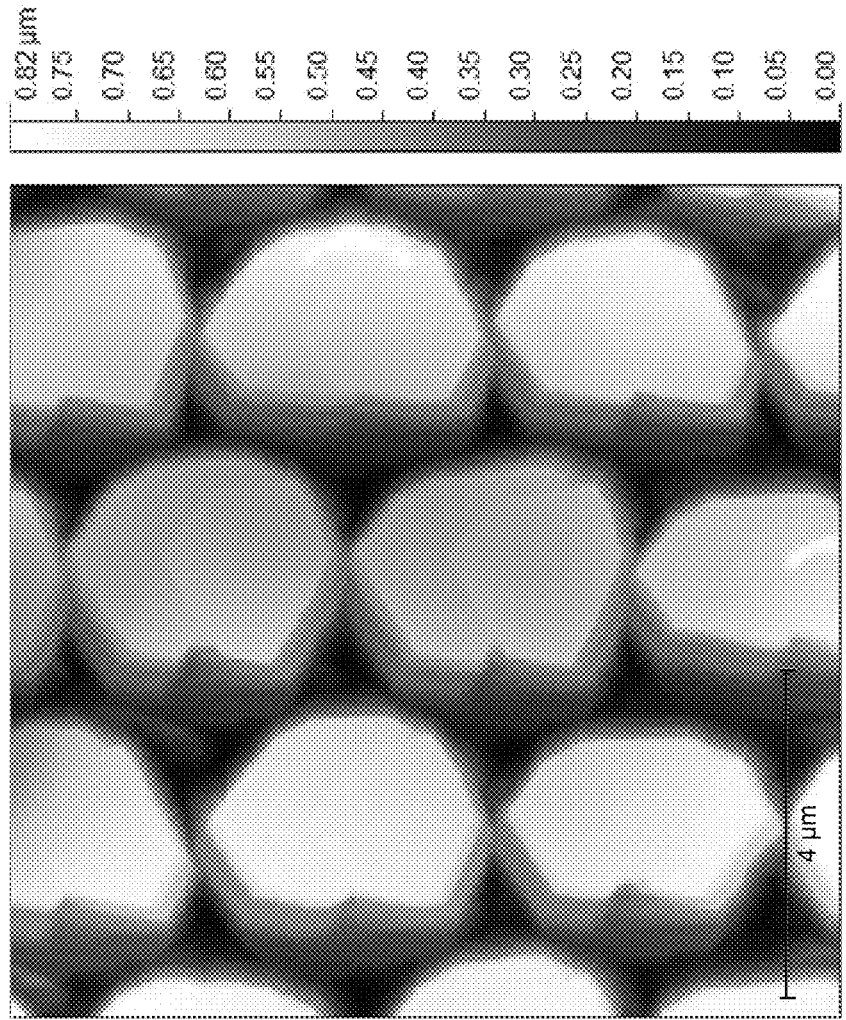
FIG. 8 shows an illustrative two dimensional scan after 3 μm of growth of a layer on a patterned surface according to an embodiment.
Figure 9:
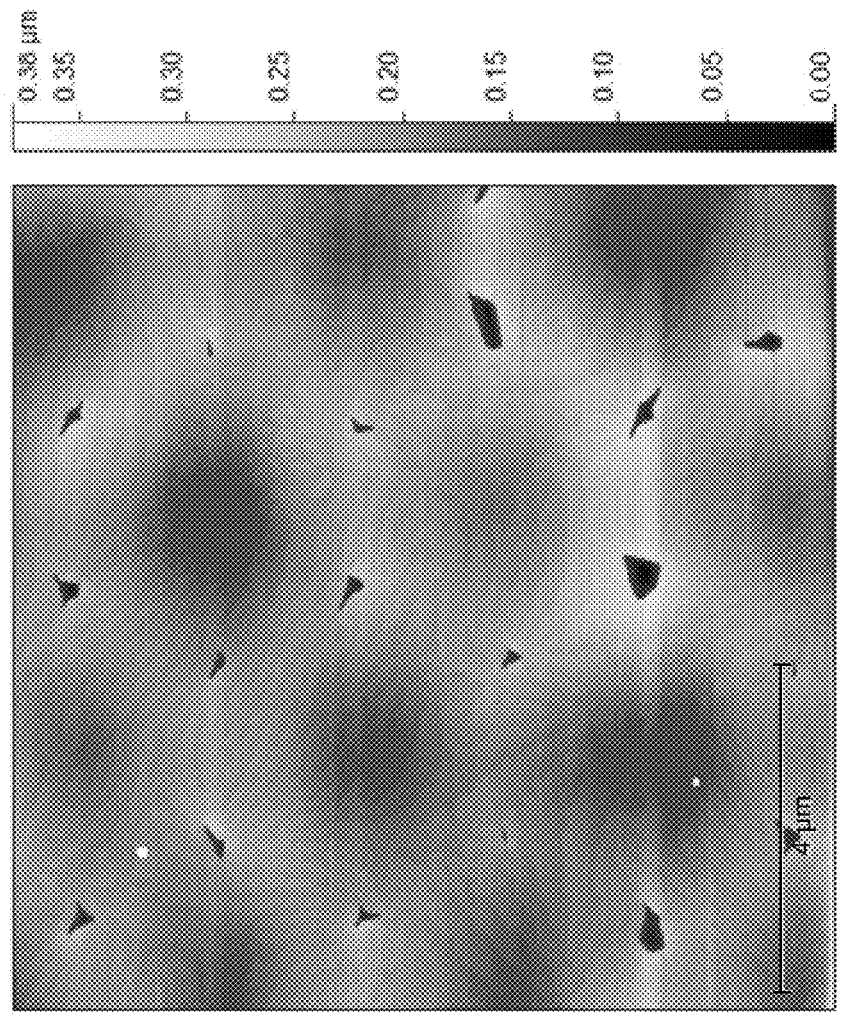
FIG. 9 shows an illustrative two dimensional scan after 5 μm of growth of a layer on a patterned surface according to an embodiment.

In any event, FIGS. 8 and 9 show illustrative two dimensional scans after 3 μm and 5 μm of growth, respectively, of a layer 14 (FIG. 1) on a patterned surface 40 (FIG. 1) according to an embodiment. In an embodiment, the layer 14 can comprise AlN grown on a sapphire substrate 12 (FIG. 1) using growth conditions favoring a high lateral growth rate. As shown in FIGS. 8 and 9, the regions (e.g., islands) of the layer 14 grown on the patterned surface 40 of the substrate 12 have coalesced into a single layer. To this extent, as shown in FIG. 9, almost complete coalescence is achieved after 5 μm of growth.

In an embodiment, a surface of a substrate 12 can include multiple patterns. For example, FIG. 10 shows a two dimensional top view of an illustrative patterned surface of a substrate 12 according to a third embodiment. In this case, the substrate 12 includes a plurality of stripes, such as stripes 70A and 70B, of an isolating material. In an embodiment, the isolating material comprises silicon dioxide. As illustrated, the stripes 70A, 70B can form a plurality of regions, such as regions 72A and 72B, each of which is isolated from another region by the stripes 70A, 70B. Each region 72A, 72B can comprise a patterned surface configured as described herein. Furthermore, the plurality of regions 72A, 72B can include patterned surfaces formed using a different solution and/or having different attributes. In this manner, each region 72A, 72B can comprise a configuration, which is suitable for stress reduction through lateral epitaxial overgrowth, selective area growth, selective polycrystalline growth, and/or the like.

Returning to FIG. 1, the device 10 can include one or more at least partially reflective layers on a first side of the active region 18 and one or more layers having a profiled surface 50A-50B on an opposing side of the active region 18 through which radiation generated in the active region 18 can leave the device 10. As illustrated, each profiled surface 50A-50B is configured to provide a boundary for an interface between two adjacent layers and/or an interface between the device 10 and the surrounding environment that is uneven or rough rather than substantially smooth. In an embodiment, the device 10 can include a profiled surface 50A-50B at each interface where the refractive index changes abruptly (e.g., a difference in refractive indexes greater than or equal to approximately five percent). For example, as described herein, the substrate 12 can be made of sapphire, the buffer layer 14 can be AlN, and the cladding layer 16 can be AlGaN. For an illustrative target wavelength, these materials can have indexes of refraction of 1.8, 2.3, and 2.5, respectively. To this extent, the device 10 is shown including a profiled surface 50A at the interface between the substrate 12 and the environment (which has an index of refraction of approximately one); and a profiled surface 50B at the interface between the n-type cladding layer 16 and the buffer layer 14. In this case, the buffer layer 14 can act as a light extraction film inserted between two materials with two different refraction indexes to provide a more gradual transition of refraction indexes.

It is understood that various embodiments of the device 10 can include a profiled surface configured as described herein at any combination of one or more interfaces. To this extent, a profiled surface can be included on any type of group III-nitride based semiconductor surface, such as AlInGaN or AlBGaN semiconductor alloys. Furthermore, a profiled surface can be included, for example, on an ultraviolet transparent glass, a polymer with a matched index deposited over a group III-nitride based semiconductor surface, and/or the like.

Each profiled surface 50A-50B can be configured to improve the extraction of radiation from a corresponding at least partially transparent layer 12, 14, 16, respectively. For example, during operation of the device 10, radiation can be generated in the active region 18 and travel through at least partially transparent layers 16, 14, 12, before being emitted from the device 10. The profiled surface 50B can be configured to increase the amount of radiation that exits a first layer 16 and enters an adjacent layer 14 as compared to a device having substantially smooth boundaries between the layers 12, 14, 16. Similarly, the profiled surface 50A can be configured to increase the amount of radiation that exits the device 10, e.g., via substrate 12, and enters into the surrounding environment, as compared to a device having a substantially smooth outer surface.

As illustrated, a profiled surface 50A-50B can be formed using a plurality of roughness elements, such as roughness elements 52A, 52B forming a part of the profiled surface 50A. Each roughness element 52A, 52B can be configured to provide additional surfaces for reflecting and refracting light, thereby facilitating light extraction from the corresponding layer (e.g., the substrate 12). In an embodiment, a roughness element 52A, 52B is formed of a large roughness component, on which is superimposed a small roughness component as described herein. While each of the profiled surfaces 50A-50B are shown including a particular number of roughness elements 52A, 52B, each of which is configured substantially similar to the other, it is understood that each profiled surface 50A-50B can be formed of any number of roughness elements having any combination of configurations.

In an embodiment, the large roughness components of the roughness elements 52A, 52B provide variation of the profiled surface 50A having a characteristic scale greater than a target wavelength. The target wavelength can be selected based on a peak wavelength of the radiation desired to pass through the interface during operation of the device 10 and can be within any range of wavelengths, including visible light, ultraviolet radiation, deep ultraviolet radiation, infrared light, and/or the like. In an embodiment, the target wavelength corresponds to the peak wavelength of the radiation generated in the active region 18. In a more particular embodiment, the characteristic scale of the variation provided by the large roughness components is approximately an order of magnitude (e.g., ten times) larger than the target wavelength, and can be determined based on the average height and/or width of the large roughness components. In an embodiment, the large roughness components have comparable heights and widths, e.g., of approximately two to four micrometers. Inclusion of the large roughness components can reduce losses associated with TIR.

Additionally, the small roughness components of the roughness elements 52A, 52B can provide variation of the profiled surface 50A having a characteristic scale on the order of the target wavelength. To this extent, the characteristic scale of the variation provided by the small roughness components can be between approximately ten to two hundred percent of the target wavelength, and can be determined based on the average height of the small roughness components. In an embodiment, the small roughness components have heights between approximately ten to one hundred nanometers. Inclusion of the small roughness components can reduce Fresnel losses. Furthermore, the small roughness components can form a photonic crystal, which is configured to guide the radiation of a target wavelength to facilitate its extraction from the layer.

Figure 11A:
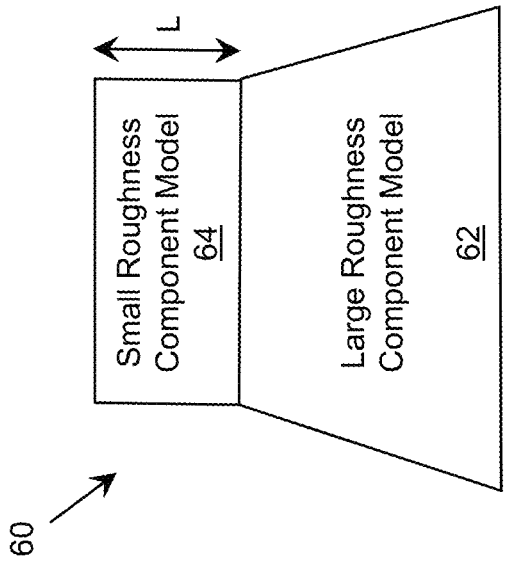
FIGS. 11A and 11B show an illustrative roughness element and an illustrative model for a roughness element, respectively, according to an embodiment.
Figure 11B:
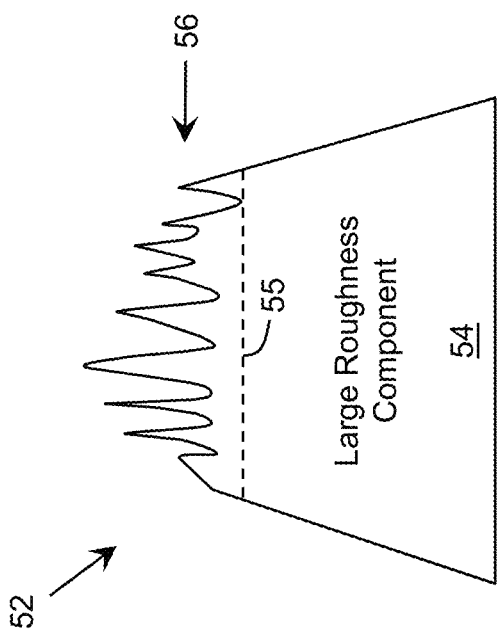

FIGS. 11A and 11B show an illustrative roughness element 52 and an illustrative roughness element model 60, respectively, according to an embodiment. As illustrated in FIG. 11A, the roughness element 52 includes a large roughness component 54 on which is superimposed a small roughness component 56. The large roughness component 54 is shown having a truncated triangular cross section, which can correspond to a truncated cone or a truncated pyramid having any number of sides. The small roughness component 56 is illustrated as a series of peaks and valleys of material having random variations in heights and locations extending from the truncated portion 55 of the large roughness component 54. The small roughness component 56 can reduce Fresnel losses. As illustrated in FIG. 11B, the roughness element model 60 can include a large roughness component model 62 and a small roughness component model 64. The large roughness component model 62 can comprise, for example, a truncated cone or a truncated pyramid shape. The small roughness component model 64 can model the small roughness component 56 as an intermediate layer having a thickness L, where the thickness corresponds to the characteristic scale of the small roughness component 56 and can be measured as the distance between the lowest valley and the highest peak on the roughness element 52.

The small roughness component 56 can introduce a graded refractive index into the roughness element 52. In particular, for a given height h along the thickness L of the intermediate layer of the small roughness component model 64, a corresponding index of refraction can be estimated by calculating an average between the refractive index of the material forming the roughness element 52 and the material adjacent to the roughness element 52 (e.g., the layer/environment into which the radiation is transmitted after exiting the roughness element 52), where the average is weighted by a fractional cross sectional area of the small roughness component 56 at the given height h.

Returning to FIG. 1, it is understood that a device 10, or a heterostructure used in forming a device 10, including a substrate 12 having a patterned surface and/or one or more layers having a profiled surface, such as layers 12, 14, and 16, can be fabricated using any solution. For example, an emitting device/heterostructure can be manufactured by obtaining (e.g., forming, preparing, acquiring, and/or the like) a substrate 12, forming (e.g., growing, depositing, adhering, and/or the like) a buffer layer 14 thereon, and forming an n-type cladding layer 16 over the buffer layer 14. Furthermore, the active region 18, e.g., including quantum wells and barriers, can be formed over the n-type cladding layer 16 using any solution. The p-type layer 20 can be formed over the active region 18 and the p-type cladding layer 22 can be formed on the p-type layer 20 using any solution. Additionally, one or more metal layers, contacts, and/or additional layers can be formed using any solution. Furthermore, the heterostructure/device can be attached to a submount via contact pads.

It is understood that the fabrication of the emitting device/heterostructure can include the deposition and removal of a temporary layer, such as mask layer, the patterning one or more layers, such as the substrate 12 as described herein, the formation of one or more additional layers not shown, and/or the like. To this extent, a profiled surface 50A-50B can be fabricated using any combination of deposition and/or etching. For example, the fabrication can include selective deposition and/or etching of nanoscale objects, such as nanodots and/or nanorods, of the material to form the large and/or small roughness components. Such deposition and/or etching can be used to form periodic and/or non-periodic random patterns.

While shown and described herein as a method of designing and/or fabricating an emitting device to improve material growth and/or extraction of light from the device, it is understood that aspects of the invention further provide various alternative embodiments. For example, aspects of the invention can be implemented to facilitate the transmission of light within the device, e.g., as part of optical pumping of a laser light generating structure, excitation of a carrier gas using a laser pulse, and/or the like. Similarly, an embodiment of the invention can be implemented in conjunction with a sensing device, such as a photosensor or a photodetector. In each case, a profiled surface can be included in an exterior surface of the device and/or an interface of two adjacent layers of the device in order to improve material growth of an adjacent layer and/or facilitate the transmission of light through the interface in a desired direction.

Figure 12:
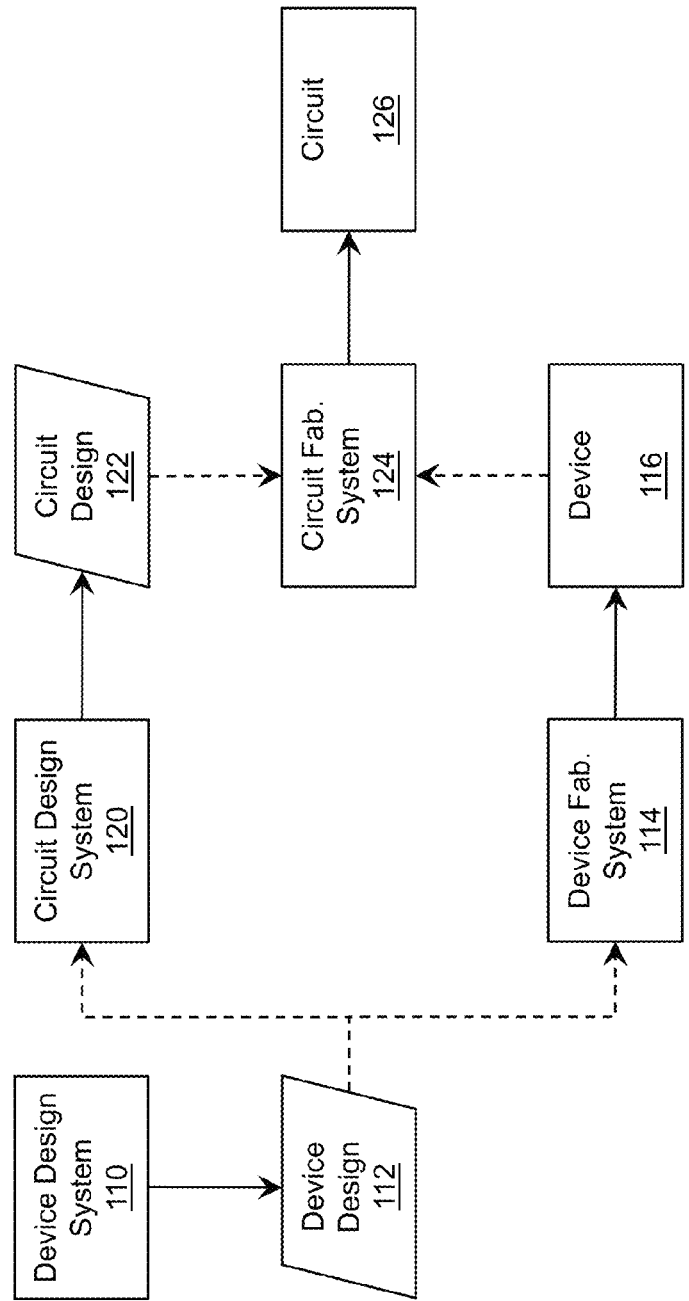
FIG. 12 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 12 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A device comprising:
   a substrate comprising a patterned surface, wherein the patterned surface includes a set of substantially flat top surfaces and a plurality of openings, wherein each substantially flat top surface has a root mean square roughness less than approximately 0.5 nanometers, wherein the plurality of openings have a characteristic size between approximately 0.1 micron and five microns, wherein the substrate is an at least partially transparent layer, and wherein the substrate includes an outer surface having a profiled surface, the profiled surface including:
   a set of large roughness components providing a first variation of the profiled surface having a characteristic scale approximately an order of magnitude larger than a target wavelength of the radiation; and
   a set of small roughness components providing a second variation of the profiled surface having a characteristic scale on the order of the target wavelength of the radiation, wherein the set of small roughness components are superimposed on the set of large roughness components.

2. The device of claim 1, wherein the patterned surface is formed from a plurality of protruding regions, each protruding region having one of the set of substantially flat top surfaces, wherein an opening between two adjacent protruding regions has a diameter less than or equal to a diameter of each of the top surfaces of the two adjacent protruding regions.

3. The device of claim 1, wherein the substrate is formed of sapphire.

4. The device of claim 1, wherein the substrate is formed of one of: silicon, germanium, silicon carbide, a group III-nitride, or lithium gallate.

5. The device of claim 1, further comprising a group III-nitride layer formed directly on the patterned surface of the substrate.

6. The device of claim 1, wherein the substrate further comprises a plurality of silicon dioxide stripes.

7. The device of claim 1, wherein the device is configured to operate as one of: a light emitting diode, a laser diode, or a super-luminescent light emitting diode.

8. A method comprising:
obtaining a substrate of a device having a patterned surface, wherein the patterned surface includes a set of substantially flat top surfaces and a plurality of openings, wherein each substantially flat top surface has a root mean square roughness less than approximately 0.5 nanometers, wherein the plurality of openings have a characteristic size between approximately 0.1 micron and five microns, wherein the substrate is an at least partially transparent layer; and
forming a profiled surface on an outer surface of the substrate, the profiled surface including:
a set of large roughness components providing a first non-uniform variation of the profiled surface having a characteristic scale approximately an order of magnitude larger than a target wavelength of the radiation; and
a set of small roughness components providing a second non-uniform variation of the profiled surface having a characteristic scale on the order of the target wavelength of the radiation, wherein the set of small roughness components are superimposed on the set of large roughness components.

9. The method of claim 8, further comprising fabricating the device including the substrate.

10. The method of claim 8, wherein the obtaining includes fabricating the patterned surface.

11. The method of claim 9, wherein the fabricating includes growing a group III-nitride layer directly on the patterned surface of the substrate.

12. The method of claim 11, wherein the growing uses an epitaxial process favoring lateral growth of the layer.

13. The method of claim 11, wherein the epitaxial process includes a material deposition process selected from the group consisting of: metal organic chemical vapor deposition (MOCVD), molecular beam epitaxy (MBE), hydride vapor phase epitaxy (HVPE), or a modified version of any of MOCVD, MBE, or HVPE.

14. The method of claim 11, wherein the growing is performed at a temperature between approximately 400 degrees Celsius and approximately 1500 degrees Celsius.

15. The method of claim 11, wherein the growing is performed at a pressure between approximately $1\times10^{-5}$ Torr and approximately 1000 Torr.

16. The method of claim 11, wherein the growing uses a flux ratio between nitrogen and the group III elements in the growth chamber between approximately 1 and approximately 10000.

17. A system comprising:
a computer system configured to implement a method of fabricating a device, the method comprising:
fabricating a patterned surface for a substrate of the device, wherein the patterned surface includes a set of substantially flat top surfaces and a plurality of openings, wherein each substantially flat top surface has a root mean square roughness less than approximately 0.5 nanometers, and wherein the plurality of openings have a characteristic size between approximately 0.1 micron and five microns;
forming a profiled surface on an outer surface of the substrate, the profiled surface including:
a set of large roughness components providing a first non-uniform variation of the profiled surface having a characteristic scale approximately an order of magnitude larger than a target wavelength of the radiation; and
a set of small roughness components providing a second non-uniform variation of the profiled surface having a characteristic scale on the order of the target wavelength of the radiation, wherein the set of small roughness components are superimposed on the set of large roughness components; and
growing a group III-nitride layer directly on the patterned surface of the substrate.

18. The system of claim 17, wherein the growing uses an epitaxial process favoring lateral growth of the layer.

19. The system of claim 17, wherein the patterned surface is formed from a plurality of protruding regions, each protruding region having one of the set of substantially flat top surfaces, wherein an opening between two adjacent protruding regions has a diameter less than or equal to a diameter of each of the top surfaces of the two adjacent protruding regions.

20. The method of claim 8, wherein the patterned surface is formed from a plurality of protruding regions, each protruding region having one of the set of substantially flat top surfaces, wherein an opening between two adjacent protruding regions has a diameter less than or equal to a diameter of each of the top surfaces of the two adjacent protruding regions.

* * * * *

UNITED STATES PATENT AND TRADEMARK OFFICE
CERTIFICATE OF CORRECTION

PATENT NO. : 8,981,403 B2  
APPLICATION NO. : 13/605007  
DATED : March 17, 2015  
INVENTOR(S) : Shatalov et al.

Page 1 of 1

It is certified that error appears in the above-identified patent and that said Letters Patent is hereby corrected as shown below:

On the title page, in the Related U.S. Application Data, item 60, delete "61/531,400" and insert --61/531,440--.

Signed and Sealed this  
Sixteenth Day of June, 2015

Michelle K. Lee  
*Director of the United States Patent and Trademark Office*